(12) United States Patent
Kim et al.

(10) Patent No.: US 10,084,148 B2
(45) Date of Patent: Sep. 25, 2018

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Byungsoo Kim, Gyeonggi-do (KR); EunJung Park, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 144 days.

(21) Appl. No.: 14/963,467

(22) Filed: Dec. 9, 2015

(65) Prior Publication Data
US 2016/0172616 A1    Jun. 16, 2016

(30) Foreign Application Priority Data
Dec. 12, 2014  (KR) .................... 10-2014-0179718

(51) Int. Cl.
*H01L 51/50* (2006.01)
*H01L 51/52* (2006.01)
*H01L 51/56* (2006.01)
*H01L 51/00* (2006.01)

(52) U.S. Cl.
CPC ...... *H01L 51/5056* (2013.01); *H01L 51/5072* (2013.01); *H01L 51/5225* (2013.01); *H01L 51/5278* (2013.01); *H01L 51/0026* (2013.01); *H01L 51/56* (2013.01)

(58) Field of Classification Search
CPC ............. H01L 51/5056; H01L 51/5072; H01L 51/5225; H01L 51/5278; H01L 51/0026; H01L 51/56
See application file for complete search history.

(56) References Cited

U.S. PATENT DOCUMENTS

| | | | | |
|---|---|---|---|---|
| 2011/0073885 A1* | 3/2011 | Kim | .................... | H01L 27/3211 257/89 |
| 2012/0252149 A1* | 10/2012 | Hiroki | ................. | H01L 27/3211 438/34 |
| 2015/0008414 A1* | 1/2015 | Isobe | .................. | H01L 51/5228 257/40 |
| 2016/0254474 A1* | 9/2016 | Zou | ..................... | H01L 51/5221 257/40 |

* cited by examiner

*Primary Examiner* — Fernando L Toledo
*Assistant Examiner* — Neil Prasad
(74) *Attorney, Agent, or Firm* — Morgan, Lewis & Bockius LLP (57) ABSTRACT

An organic light emitting display device includes: a substrate including a display area having a plurality of pixel regions and a non-display area; a first electrode on the substrate; a first organic emissive layer on the first electrode; a charge generation layer on the first organic emissive layer as a common layer for the plurality of pixel regions; a second organic emissive layer on the charge generation layer; a second electrode on the second organic emissive layer as a common electrode for the plurality of pixel regions; and an anti-contact layer between the charge generation layer and the second electrode as a common layer for the plurality of pixel regions. The anti-contact layer completely surrounds the charge generation layer.

16 Claims, 9 Drawing Sheets

ORGANIC LIGHT EMITTING DISPLAY DEVICE AND METHOD OF MANUFACTURING THE SAME

CROSS-REFERENCE TO RELATED APPLICATIONS

This application claims the priority of Korean Patent Application No. 10-2014-0179718 filed on Dec. 12, 2014, in the Korean Intellectual Property Office, the disclosure of which is incorporated herein by reference.

BACKGROUND

Technical Field

The present disclosure relates to a display device, and more particularly, to an organic light emitting display device and a method of manufacturing the same.

Description of the Related Art

An organic light emitting display device (OLED) is a self-luminous display that does not require an additional light source, such as a backlight for a liquid crystal display (LCD). Therefore, organic light emitting display devices can be made lighter and thinner. Further, an organic light emitting display device has advantages in that it is driven with low voltage to consume less power, and that it represents vivid colors and has short response time, wide viewing angle and good contrast ratio (CR). For these reasons, an organic light emitting display device is currently under development as the next generation display.

An organic light emitting display device essentially includes an organic emissive layer in which electrons and holes combine to emit visible rays. Recently, substantial research has been directed toward developing a tandem organic light emitting display device, in which a plurality of organic emissive layers is stacked on one another. It is known that a tandem organic light emitting display device has high efficiency and long lifetime and thus is suitable for realizing a large screen organic light emitting display device.

For a tandem organic light emitting display device having a plurality of organic emissive layers stacked on one another, a reverse-biased diode may be formed between the organic emissive layers. In order to suppress a reverse-biased diode, it is common to dispose a charge generation layer between the plurality of organic emissive layers so as to efficiently supply electrons and holes into the organic emissive layers.

Figure 1:
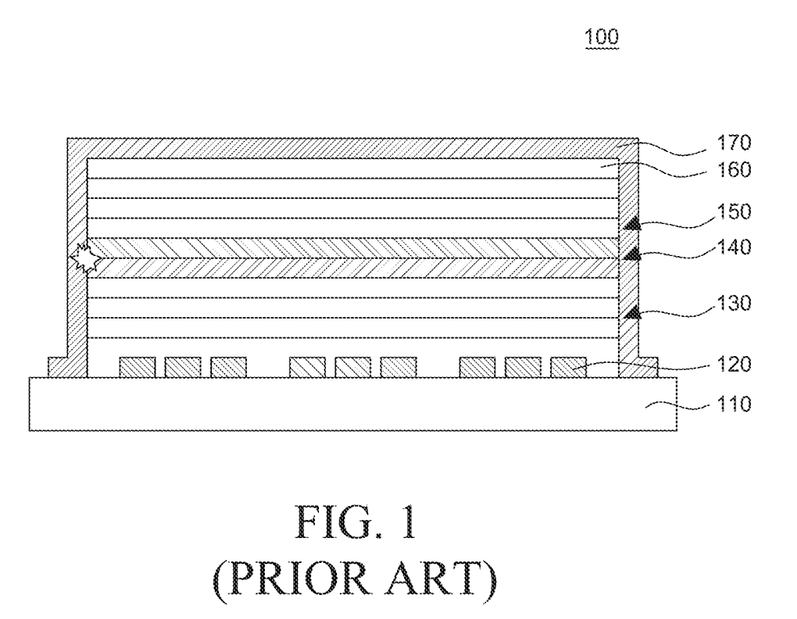
FIG. 1 is a schematic cross-sectional plan view of a tandem organic light emitting display device in the related art.

FIG. 1 is a schematic cross-sectional plan view of a tandem organic light emitting display device in the related art.

Referring to FIG. 1, the tandem organic light emitting display device 100 includes a substrate 110, a first electrode 120, a first light emitting unit 130, a charge generation layer 140, a second light emitting unit 150, an electron injection layer 160 and a second electrode 170.

The charge generation layer 140 is disposed between the first light emitting unit 130 and the second light emitting unit 150, each of which includes an organic emissive layer. The charge generation layer 140 adjusts balance of electric charges between the first light emitting unit 130 and the second light emitting unit 150. The second electrode 170 supplies electric charges into the organic emissive layer of the first light emitting unit 130 and the organic emissive layer of the second light emitting unit 150 equally. Thus, light is emitted from each of the first light emitting unit 130 and the second light emitting unit 150.

Typically, the second electrode 170 is extended to edges of the substrate 100 and is connected to Vss supply lines disposed at the edges of the substrate 100. As the second electrode 170 is extended to the edges of the substrate 100, the second electrode 170 often comes in contact with the charge generation layer 140 around the edges of the substrate 110.

If the second electrode 170 comes in contact with the charge generation layer 140, electric charges supplied from the second electrode 170 may fail to be supplied to the organic emissive layer of the second light emitting unit 150. However, the electric charges may be supplied to the organic emissive layer of the first light emitting unit 130 via the charge generation layer 140. When this happens, the electric charges from the second electrode 170 are not equally supplied to the first light emitting unit 130 and the second light emitting unit 150 but are supplied to the first light emitting unit 130 too much. As a result, more light is emitted from the edges of the substrate 100, such that the organic emissive layer of the first light emitting unit 130 is likely to be degraded. Accordingly, the lifetime of the organic light emitting display device 100 is also significantly shortened. The issue of failing to balance electric charges between the first light emitting unit 130 and the second light emitting unit 150 as the second electrode 170 comes in contact with the charge generation layer 140 especially becomes serious as the temperature increases since electric charges become more active.

SUMMARY

Accordingly, the present invention is directed to an organic light emitting display and a method of manufacturing the same that substantially obviates one or more of the problems due to limitations and disadvantages of the related art.

The inventors of the application have noticed the above-described problem and have found that it is possible to avoid the second electrode from coming in contact with the charge generation layer at edges of a substrate by disposing an anti-contact layer between the second electrode and the charge generation layer that completely surrounds the charge generation layer.

An object of the present invention is to provide an organic light emitting display device leaving no chance that a second electrode comes in contact with a charge generation layer, and a method of manufacturing the same.

Another object of the present invention is to provide a tandem organic light emitting display device with longer lifetime, and a method of manufacturing the same.

Another object of the present invention is to provide an organic light emitting display device capable of avoiding a second electrode from being in direct contact with a charge generation layer, and a method of manufacturing the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device, including: a substrate including a display area having a plurality of pixel regions and a non-display area; a first electrode disposed on the substrate; a first organic emissive layer disposed on the first electrode; a charge generation layer disposed on the first organic emissive layer as a common layer for the plurality of pixel regions; a second organic emissive layer disposed on the charge generation layer; a second electrode disposed on the second organic emissive layer as a common electrode for the plurality of pixel regions; and an anti-contact layer disposed between the charge generation layer and the second electrode as a common layer for the plurality of pixel regions. The anti-contact layer completely surrounds the charge generation layer. In the organic light emitting display device, electric charges can be equally supplied to the first organic emissive layer and the second organic emissive layer.

The anti-contact layer may avoid the charge generation layer from being in contact with the second electrode.

The charge generation layer may include an n-type charge generation layer and a p-type charge generation layer.

The p-type charge generation layer may be disposed on the n-type charge generation layer.

The thickness of the anti-contact layer may be equal to or larger than 10 Å.

The anti-contact layer may be one of a hole transporting layer, a hole blocking layer, an electron transporting layer, an electron injection layer and an electron blocking layer.

The anti-contact layer may be the electron transporting layer.

The anti-contact layer may be two or more of a hole transporting layer, a hole blocking layer, an electron transporting layer, an electron injection layer and an electron blocking layer.

The anti-contact layer may be disposed only in the display area.

The second electrode may be disposed in the display area and in a part of the non-display area.

The second electrode may be disposed such that it completely surrounds the anti-contact layer.

In another aspect, a method of manufacturing an organic light emitting display device, including: disposing a first electrode on a substrate comprising a display area having a plurality of pixel regions and a non-display area; disposing a first organic emissive layer on the first electrode; disposing a charge generation layer on the first organic emissive layer as a common layer for the plurality of pixel regions; disposing a second organic emissive layer on the charge generation layer; and disposing a second electrode on the second organic emissive layer as a common layer for the plurality of pixel regions, the method comprising: prior to the disposing the second electrode, disposing an anti-contact layer on the charge generation layer as a common layer for the plurality of pixel regions, wherein the anti-contact layer completely surrounds the charge generation layer. According to the method of manufacturing an organic light emitting display device according to an exemplary embodiment of the present disclosure, an organic light emitting display device with improved lifetime can be manufactured.

The disposing the charge generation layer and the disposing the anti-contact layer may be performed by thermal evaporation.

The disposing of the charge generation layer may be performed using a first common mask, and the disposing of the anti-contact layer may be performed using a second common mask.

An opening of the second common mask may be larger than an opening of the first common mask.

The disposing of the second electrode may be performed using a third common mask, and an opening of the third common mask may be larger than the openings of the first and second common masks.

Particulars in the exemplary embodiments of the present disclosure will be described in the detail description with reference to the accompanying drawings.

According to an exemplary embodiment of the present disclosure, electric charges from a second electrode can be equally supplied to the first and second light emitting units.

Further, it is possible to suppress the issue of light being emitted more at the edges of a substrate as the second electrode comes in contact with the charge generation layer.

An organic light emitting display device according to an exemplary embodiment of the present disclosure has longer lifetime and thus is advantageously used for mobile devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure can be defined by the claims.

The figures, dimensions, ratios, angles, numbers of elements given in the drawings are merely illustrative and are not limiting. Like reference numerals denote like elements throughout the descriptions. Further, in describing the present disclosure, descriptions on well-known technologies may be omitted in order not to obscure the gist of the present disclosure. It is to be noticed that the terms "comprising,"

"having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B i" and "an element A next to an element B," another element C may be disposed between the elements A and B unless the term "directly" or "immediately" is explicitly used.

As used herein, the phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present invention may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
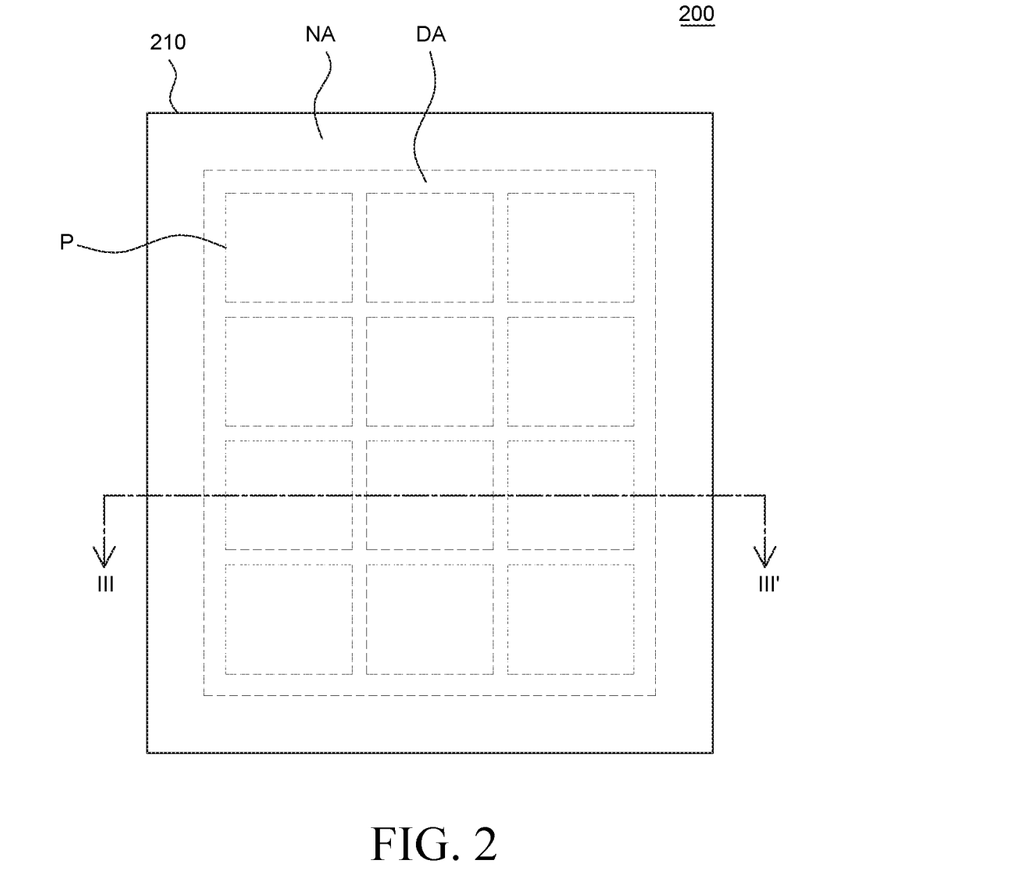
FIG. 2 is a schematic plan view for illustrating areas on a substrate of a tandem organic light emitting display device according to an exemplary embodiment of the present disclosure.
Figure 3:
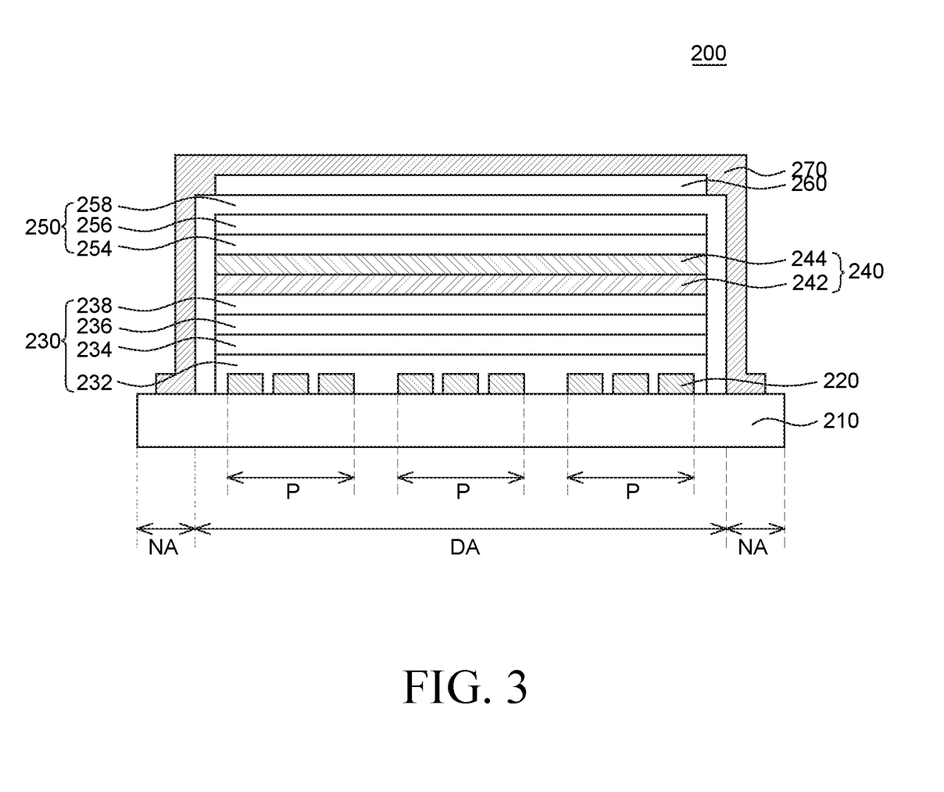
FIG. 3 is a schematic cross-sectional view of an organic light emitting display device according to an exemplary embodiment of the present disclosure, taken along line III-III'.

FIG. 2 is a schematic plan view for illustrating areas on a substrate of a tandem organic light emitting display device according to an exemplary embodiment of the present disclosure. FIG. 3 is a schematic cross-sectional view of an organic light emitting display device according to an exemplary embodiment of the present disclosure, taken along line III-III'.

Referring to FIGS. 2 and 3, an organic light emitting display device 200 according to an exemplary embodiment of the present disclosure includes a substrate 210, a first electrode 220, a first light emitting unit 230, a charge generation layer 240, a second light emitting unit 250, an electron injection layer 260 and a second electrode 270.

The substrate 210 supports thereon a variety of elements of the organic light emitting display device 200. The substrate 210 may be made of a material having good flexibility, e.g., polyimide.

Referring to FIGS. 2 and 3, the substrate 210 includes a display area DA and a non-display area NA. The display area DA refers to an area of the organic light emitting display device 200 where an image is displayed. The non-display area DA refers to an area of the organic light emitting display device 200 where no image is displayed. The display area DA includes a plurality of pixel regions P that reproduces an image. A single pixel region P displays a single color and includes a plurality of sub-pixel regions. The non-display area NA is disposed such that it surrounds the display area DA.

The first electrode 220 is disposed on the substrate 210. The first electrode 220 disposed on the substrate 210 applies voltage to the first light emitting unit 230 and the second light emitting unit 250. The first electrode 220 may be either an anode or a cathode. In this connection, the second electrode 270 to be described below may be a cathode if the first electrode 220 is an anode, and vice versa. In the following descriptions, it is assumed that the first electrode 220 is an anode and the second electrode 270 is a cathode.

The first electrode 220 is an anode and may be made of a transparent, conductive material having a high work function. For example, the first electrode 220 may be made of one of indium tin oxide (ITO), indium zinc oxide (IZO), indium tin zinc oxide (ITZO), zinc oxide, and tin oxide.

As shown in FIG. 3, the first electrode 220 is not a common electrode for a plurality of pixel regions P. Specifically, the first electrode 220 is disposed separately in each of the plurality of sub-pixel regions.

The first light emitting unit 230 is disposed on the first electrode 220. The first light emitting unit 230 includes at least a first organic emissive layer 236. The first light emitting unit 230 refers to a light emitting device capable of emitting light by itself by receiving voltage from the first electrode 220 and the second electrode 270. Referring to FIG. 3, the first light emitting unit 230 includes a hole injection layer 232, a first hole transporting layer 234, a first organic emissive layer 236, and a first electron transporting layer 238.

The hole injection layer 232 facilitates hole injection and is a common layer for the plurality of pixel regions P. The hole injection layer 232 may be made of, but is not limited to, at least one selected from the group consisting of HATCN (1,4,5,8,9,11-hexaazatriphenylene-hexanitrile), CuPc (copper phthalocyanine), PEDOT (poly(3,4)-ethylenedioxythiophene), PANI(polyaniline), and NPD(N,N-dinaphthyl-N,N'-diphenylbenzidine).

The hole injection layer 232 may be formed by adding a p-dopant to the material of the first hole transporting layer 234. In doing so, the hole injection layer 232 and the first hole transporting layer 234 may be formed by the same processing equipment in a continuous process.

The first hole transporting layer 234 is disposed on the hole injection layer 232. The first hole transporting layer 234 facilitates hole transportation and is a common layer for the plurality of pixel regions P. The first hole transporting layer 234 may be made of, but is not limited to, at least one selected from the group consisting of NPD (N,N-dinaphthyl-N,N'-diphenylbenzidine), TPD (N,N'-bis-(3-methylphenyl)-N,N'-bis-(phenyl)-benzidine), s-TAD and MTDATA(4,4',4"-Tris(N-3-methylphenyl-N-phenyl-amino)-triphenyl amine).

The first organic emissive layer 236 is disposed on the first hole transporting layer 234. In the first organic emissive layer 236, electrons and holes may be combined to emit light of a color. Although the first organic emissive layer 236 is a common layer for the plurality of pixel regions P in FIG. 2, the first organic emissive layer 236 may be disposed separately in each of the plurality of sub-pixel regions.

The first electron transporting layer 238 is disposed on the first organic emissive layer 236. The first electron transporting layer 238 may be made of, but is not limited to, at least one selected from the group consisting of Alq3 (tris(8-hydroxyquinolino)aluminum), PBD(2-(4-biphenylyl)-5-(4-tertbutylpheny)-1,3,4oxadiazole), TAZ, spiro-PBD, BAlq and SAlq.

The charge generation layer 240 is disposed on the first light emitting unit 230. The charge generation layer 240 adjusts the balance of electric charges between the first light emitting unit 230 and the second light emitting unit 250. The charge generation layer 240 is a common layer for the plurality of pixel regions P. Referring to FIG. 3, the charge generation layer 240 includes an n-type charge generation layer 242 and a p-type charge generation layer 244.

The n-type charge generation layer 242 serves to facilitate electron injection into the first light emitting unit 230. The n-type charge generation layer 242 may include a host material such as Alq3 (tris(8-hydroxyquinolino)aluminum) and Bphen (4,7-diphenyl-1,10-phenanthroline), and an n-type dopant such as Li, Cs, Na, K, Sr, Ba, Ra and Mg.

The p-type charge generation layer 244 is disposed on the n-type charge generation layer 242. The p-type charge generation layer 244 serves to facilitate hole injection into the second light emitting unit 250. The p-type charge generation layer 244 may include a host material such as NPD (N,N-dinaphthyl-N,N'-diphenyl benzidine), TPD (N,N'-bis-(3-methylphenyl)-N,N'-bis-(phenyl)-benzidine) and MTDATA (4,4',4"-Tris(N-3-methylphenyl-N-phenyl-amino)-triphenylamine), and a p-type dopant such as a metal oxide, tetrafluoro-tetracyanoquinodimethane (F4-TCNQ), hexanitrile, hexaazatriphenylene, $FeCl_3$, $FeF_3$ and $SbCl_5$.

The second light emitting unit 250 is disposed on the charge generation layer 240. The second light emitting unit 250 includes at least the second organic emissive layer 256. The second light emitting unit 250 refers to a light emitting device capable of emitting light by itself by receiving voltage from the first electrode 220 and the second electrode 270. Referring to FIG. 3, the second light emitting unit 250 includes a second hole transporting layer 254, a second organic emissive layer 256, and a second electron transporting layer 258. Since the p-type charge generation layer 244 can substantially serve as a hole injection layer, the second light emitting unit 250 may not include an additional hole injection layer.

The second hole transporting layer 254, the second organic emissive layer 256 and the second electron transporting layer 258 of the second light emitting unit 250 are substantially identical to the first hole transporting layer 234, the first organic emissive layer 236 and the first electron transporting layer 238 of the first light emitting unit 230, respectively, except that the second hole transporting layer 254 or the second electron transporting layer 258 may work as an anti-contact layer. Therefore, redundant descriptions will not be given.

As can be seen from FIG. 3, the second electron transporting layer 258 as the anti-contact layer is extended more closely to edges of the substrate 210 than the charge generation layer 240 is, so that it surrounds the charge generation layer 240. This will be described in more detail below.

The electron injection layer 260 is disposed on the second light emitting unit 250. The electron injection layer 260 serves to facilitate electron injection and is a common layer for the plurality of pixel regions P. The electron injection layer 260 may be made of, but is not limited to, Alq3 (tris(8-hydroxyquinolino)aluminum), PBD (2-(4-biphenylyl)-5-(4-tert-butylpheny)-1,3,4oxadiazole), TAZ, spiro-PBD, BAlq or SAlq. The electron injection layer 260 may be eliminated.

The second electrode 270 is disposed on the electron injection layer 260. The second electrode 270 is a common layer for the plurality of pixel regions P and is disposed in the display area DA and a part of the non-display area NA. The second electrode 270 applies voltage to the first light emitting unit 230 and the second light emitting unit 250. The second electrode 270 may be connected to an additional Vss supply line to apply the same voltage to all of the pixel regions P. The second electrode 270 is a cathode and may be made of a metal material having low work function such as silver (Ag), titanium (Ti), aluminum (Al), molybdenum (Mo) or an alloy of silver (Ag) and magnesium (Mg).

Referring to FIG. 3, while the first electrode 220, the first light emitting unit 230, the charge generation layer 240, the second light emitting unit 250 and the electron injection layer 260 are disposed only in the display area DA, the second electrode 270 is disposed in the display area DA and also in a part of the non-display area NA. As a result, the second electrode 270 is extended to the non-display area NA and often comes in contact with the charge generation layer 240. If the second electrode 270 comes in contact with the charge generation layer 240, electric charges from the second electrode 270 are not equally supplied to the first organic emissive layer 236 and the second organic emissive layer 256. However, if too much electric charges from the second electrode 270 are supplied to the first organic emissive layer 236, the first organic light emitting layer 236 is rapidly degraded and the overall lifetime of the organic light emitting display device 200 may be shortened. Accordingly, it is necessary to avoid the second electrode 270 from being in contact with the charge generation layer 240.

As used herein, one or more layers which are disposed between the charge generation layer 240 and the second electrode 270 as common layers for the plurality of pixel regions P, except for the second organic emissive layer 256, are referred to as an anti-contact layer. The anti-contact layer is disposed such that it completely surrounds the charge generation layer 240. Accordingly, the charge generation layer 240 is avoided from being in contact with the second electrode 270 by virtue of the anti-contact layer. Resultantly, it is possible to solve the problem that too much electric charges from the second electrode 270 are supplied to the first organic emissive layer 236.

As shown in FIG. 3, the second hole transporting layer 254, the second organic emissive layer 256, the second electron transporting layer 258 and the electron injection layer 260 are disposed between the charge generation layer 240 and the second electrode 270 and are common layers for the plurality of pixel regions P. Additional layers may be disposed between the charge generation layer 240 and the second electrode 270 as common layers for the plurality of pixel regions P. Common layers may be a hole blocking layer that may be disposed between the second organic emissive layer 256 and the second electron transporting layer 258, and an electron blocking layer that may be disposed between the second hole transporting layer 254 and the second organic emissive layer 256. Among the above-listed layers, excluding the second organic emissive layer 256, the second hole transporting layer 254, the second electron transporting layer 258, the electron injection layer 260, the hole blocking layer and the electron blocking layer may be used as anti-contact layers. Since all of the second hole transporting layer 254, the second electron transporting layer 258, the electron injection layer 260, the hole blocking layer and the electron blocking layer are made of an organic material having properties between semiconductor and non-conductor materials, these layers do not work as a path via which electric charges move even if they are disposed between the charge generation layer 240 and the second electrode 270. Accordingly, all of the second hole transporting layer 254, the second electron transporting layer 258, the electron injection layer 260, the hole blocking layer and the electron blocking layer may be used as the anti-contact layer of the exemplary embodiment of the present disclosure.

As the layers which may be disposed between the charge generation layer 240 and the second electrode 270 are made mostly of an organic material and a molecule length of the organic material is approximately 10 Å, the thickness of the anti-contact layer is preferably equal to or larger than 10 Å. The thickness of 10 Å or greater is sufficient for the anti-contact layer to block electric charges from moving between the charge generation layer 240 and the second electrode 270.

The anti-contact layer completely surrounds the charge generation layer 240, and thus is extended more closely to the edges of the substrate 210 than the charge generation layer 240. However, if the anti-contact layer is disposed even in the non-display area NA, it may negatively affect the connection between the second electrode 270 and other wires or lines. Accordingly, it is desirable that the anti-contact layer is disposed only in the display area DA of the substrate 210. As the anti-contact layer is disposed only in the display area DA of the substrate 210 and the second electrode 270 is disposed in the display area DA and a part of the non-display area NA, the second electrode 270 can be disposed such that it completely surrounds the anti-contact layer.

In FIG. 3, the organic light emitting display device 200 according to the exemplary embodiment of the present disclosure uses the second electron transporting layer 258 as the anti-contact layer. As a result, as can be seen from FIG. 3, the second electron transporting layer 258 is a common layer for the plurality of pixel regions P and it completely surrounds the charge generation layer 240. Accordingly, electric charges cannot move between the charge generation layer 240 and the second electrode 270, and thus electric charges from the second electrode 270 can be equally supplied to the first organic emissive layer 236 and the second organic emissive layer 256. Accordingly, the lifetime of the organic light emitting display device 200 can be elongated especially at high temperature.

It will be understood that any one of the second hole transporting layer 254, the electron injection layer 260, the hole blocking layer and the electron blocking layer may be used as the anti-contact layer that completely surrounds the charge generation layer 240. In addition, two or more of the second hole transporting layer 254, the second electron transporting layer 258, the electron injection layer 260, the hole blocking layer and the electron blocking layer may work as the anti-contact layer.

Figure 4:
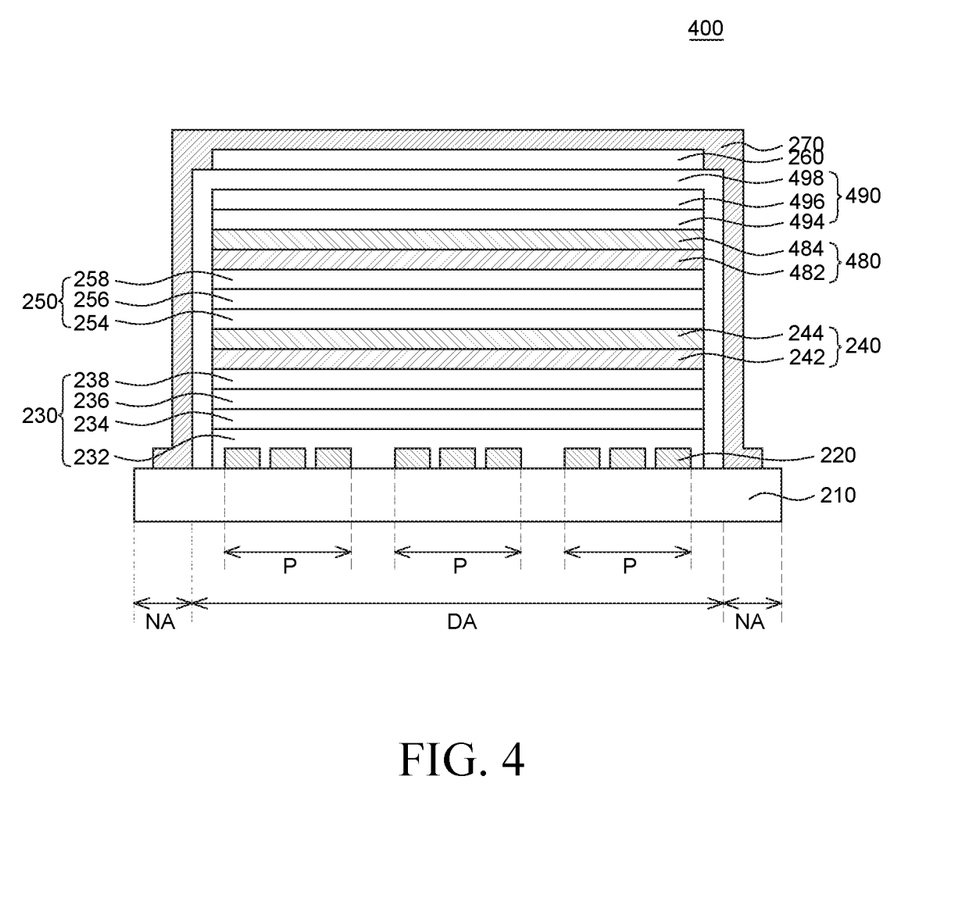
FIG. 4 is a schematic cross-sectional plan view of an organic light emitting display device according to another exemplary embodiment of the present disclosure.

FIG. 4 is a schematic cross-sectional plan view of an organic light emitting display device according to another exemplary embodiment of the present disclosure.

The organic light emitting display device 400 shown in FIG. 4 is substantially identical to the organic light emitting display device 200 shown in FIG. 2, except that a second charge generation layer 480 and a third light emitting unit 490 are further disposed on the second light emitting unit 250. Therefore, redundant descriptions will not be made.

Referring to FIG. 4, the organic light emitting display device 400 according to this exemplary embodiment of the present disclosure further includes a second charge generation layer 480 and a third light emitting unit 490.

The second charge generation layer 480 adjusts balance of electric charges between the second light emitting unit 250 and the third light emitting unit 490. The second charge generation layer 480 may include an n-type charge generation layer 482 and a p-type charge generation layer 484. The n-type charge generation layer 482 and the p-type charge generation layer 484 of the second charge generation layer 480 may be the same as the n-type charge generation layer 242 and the p-type charge generation layer 244 of the charge generation layer 240 shown in FIG. 2, respectively.

The third light emitting unit 490 is disposed on the second charge generation layer 480. The third light emitting unit 490 includes at least a third organic emissive layer 496. The third light emitting unit 490 refers to an independent light emitting device capable of emitting light by receiving voltage from the first electrode 220 and the second electrode 270. Referring to FIG. 4, the third light emitting unit 490 includes a third hole transporting layer 494, a third organic emissive layer 496, and a third electron transporting layer 498.

The third hole transporting layer 494, the third organic emissive layer 496 and the third electron transporting layer 498 of the third light emitting unit 490 are substantially identical to the first hole transporting layer 234, the first organic emissive layer 236 and the first electron transporting layer 238 of the first light emitting unit 230, except that one of the third hole transporting layer 494, the third organic emissive layer 496 and the third electron transporting layer 498 may work as an anti-contact layer. Therefore, redundant descriptions will not be given.

For the organic light emitting display device including the third light emitting unit 490, one or more layers disposed between the second charge generation layer 480 and the second electrode 270 as common layers for the plurality of pixel regions P, may be referred to as anti-contact layers, except for the third organic emissive layer 496. In FIG. 4, the organic light emitting display device 400 according to the exemplary embodiment of the present disclosure uses the third electron transporting layer 498 as the anti-contact layer. As a result, referring to FIG. 4, the third electron transporting layer 498 is a common layer for the plurality of pixel regions P and completely surrounds the first charge generation layer 240 and the second charge generation layer 480. Accordingly, electric charges cannot move between the first charge generation layer 240 and the second electrode 270 and between the second charge generation layer 240 and the second electrode 270. Thus, electric charges from the second electrode 270 can be equally supplied to the first organic emissive layer 236, the second organic emissive layer 256 and the third organic emissive layer 496.

Figure 5:
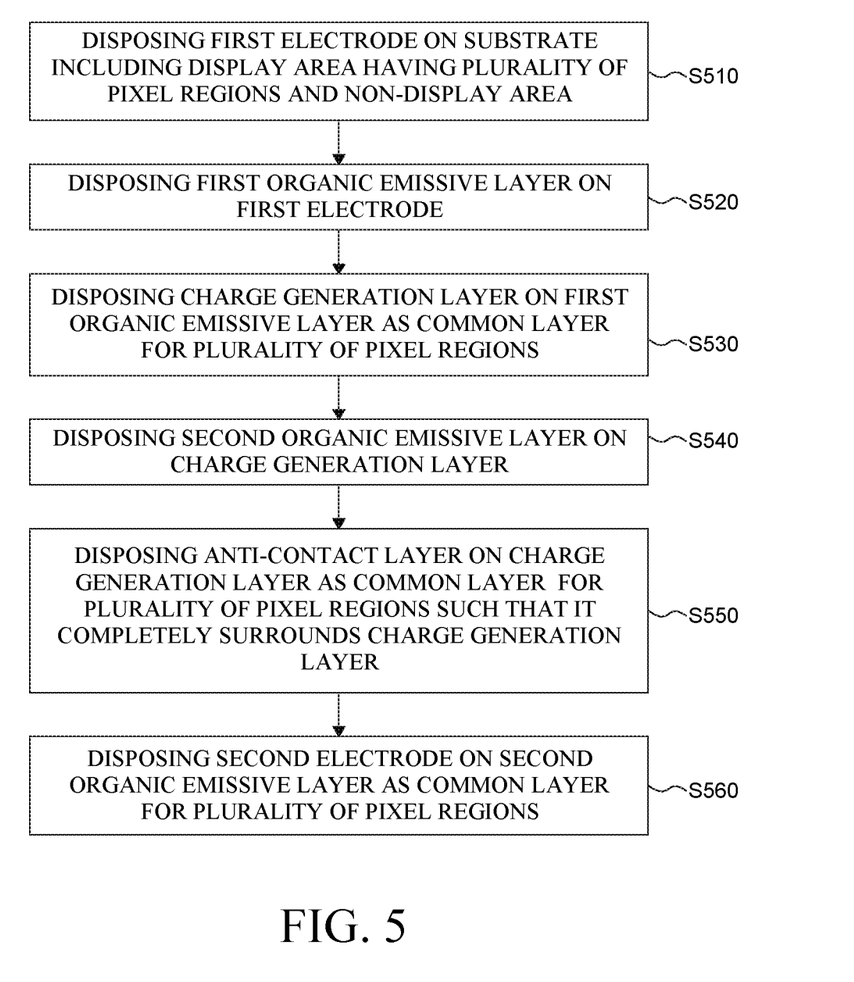
FIG. 5 is a flowchart for illustrating a method of manufacturing an organic light emitting display device according to an exemplary embodiment of the present disclosure.

FIG. 5 is a flowchart for illustrating a method of manufacturing an organic light emitting display device according to an exemplary embodiment of the present disclosure. FIGS. 6A to 6D are cross-sectional views for illustrating processes of a method of manufacturing an organic light emitting display device according to an exemplary embodiment of the present disclosure.

Figure 6A:
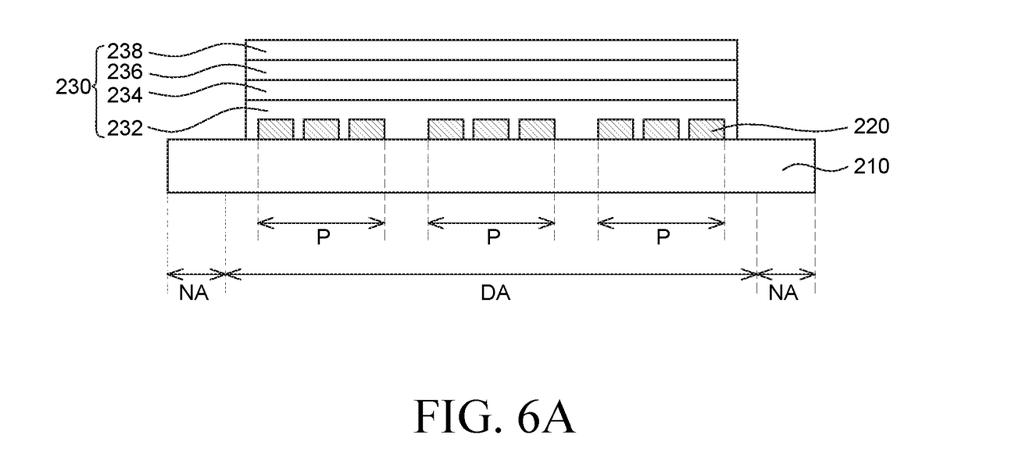
FIGS. 6A to 6D are cross-sectional views for illustrating processes of a method of manufacturing an organic light emitting display device according to an exemplary embodiment of the present disclosure.

Referring to FIG. 6A, a first electrode 220 is disposed on a substrate 210 including a display area DA having a plurality of pixel regions P and a non-display area NA (step S510). Then, a hole injection layer 232, a first hole transporting layer 234, a first organic emissive layer 236 and a first electron transporting layer 238 are disposed over the first electrodes 220 in this order (step S520).

The hole injection layer 232, the first hole transporting layer 234 and the first electron transporting layer 238 may be disposed by thermal evaporation with a common mask disposed on the entire surface of the substrate 210. The first organic emissive layer 236 may be disposed using a common mask or a fine metal mask.

Figure 6B:
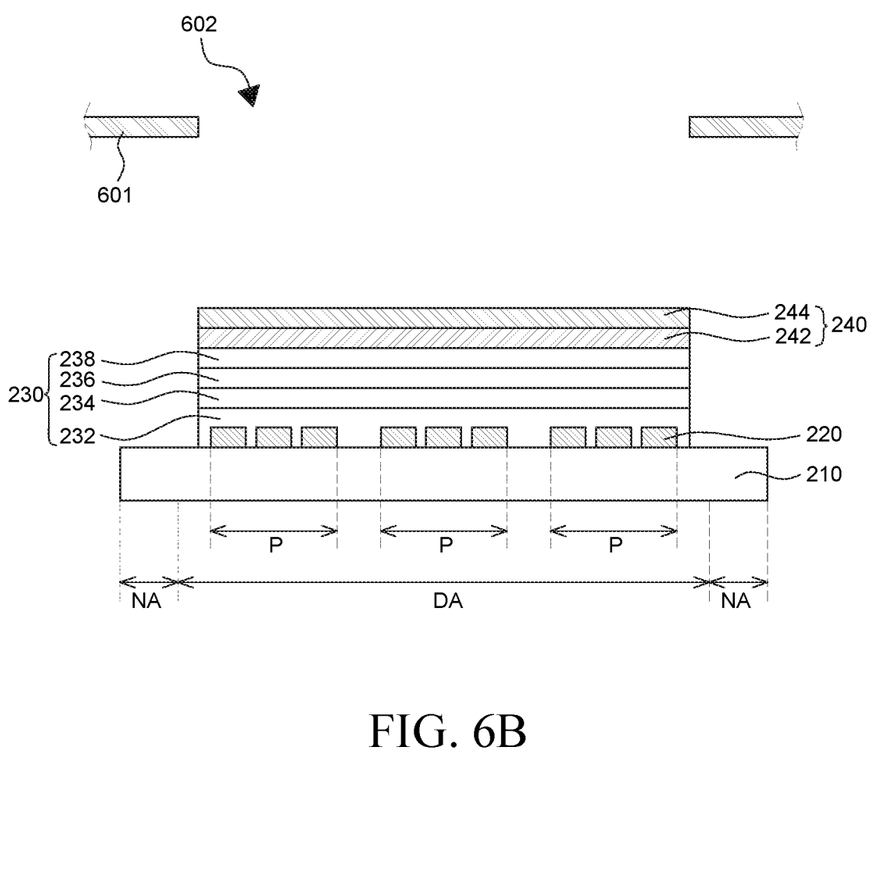

Referring to FIG. 6B, a charge generation layer 240 is disposed above the first organic emissive layer 236 as a common layer for the plurality of pixel regions P (step S530).

The charge generation layer 240 may be disposed by thermal evaporation with a first common mask 601 placed above the entire surface of the substrate 210.

Figure 6C:
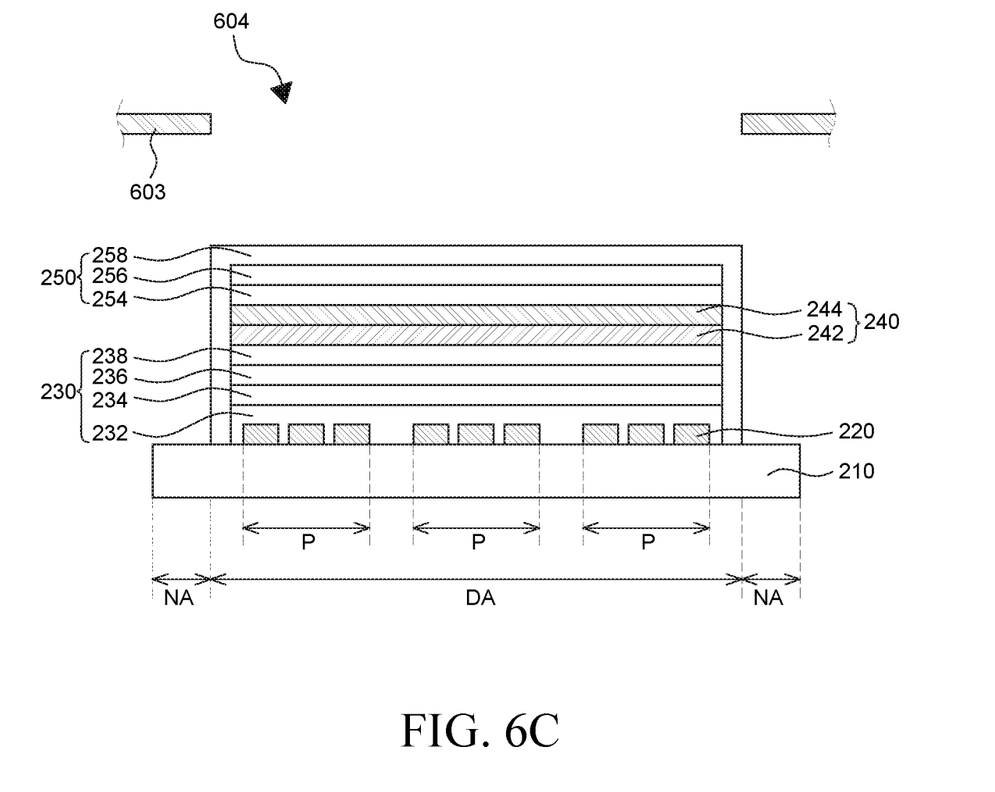

Referring to FIG. 6C, a second hole transporting layer 254 is disposed on the charge generation layer 240 and a second organic emissive layer 256 is disposed on the second hole transporting layer 254 (step S540). Then, a second electron transporting layer 258 is disposed on the second organic emissive layer 256 as an anti-contact layer for the plurality of pixel regions P such that it completely surrounds the charge generation layer 240 (step S550).

The second electron transporting layer 258 as the anti-contact layer may be disposed by thermal evaporation with a second common mask 603 placed above the entire surface of the substrate 210. As shown in FIGS. 6B and 6C, the size of an opening 604 of a second common mask 603 is larger than the size of an opening 602 of the first common mask 601. As a result, the second electron transporting layer 258 as the anti-contact layer may be disposed such that it completely surrounds the charge generation layer 240.

Figure 6D:
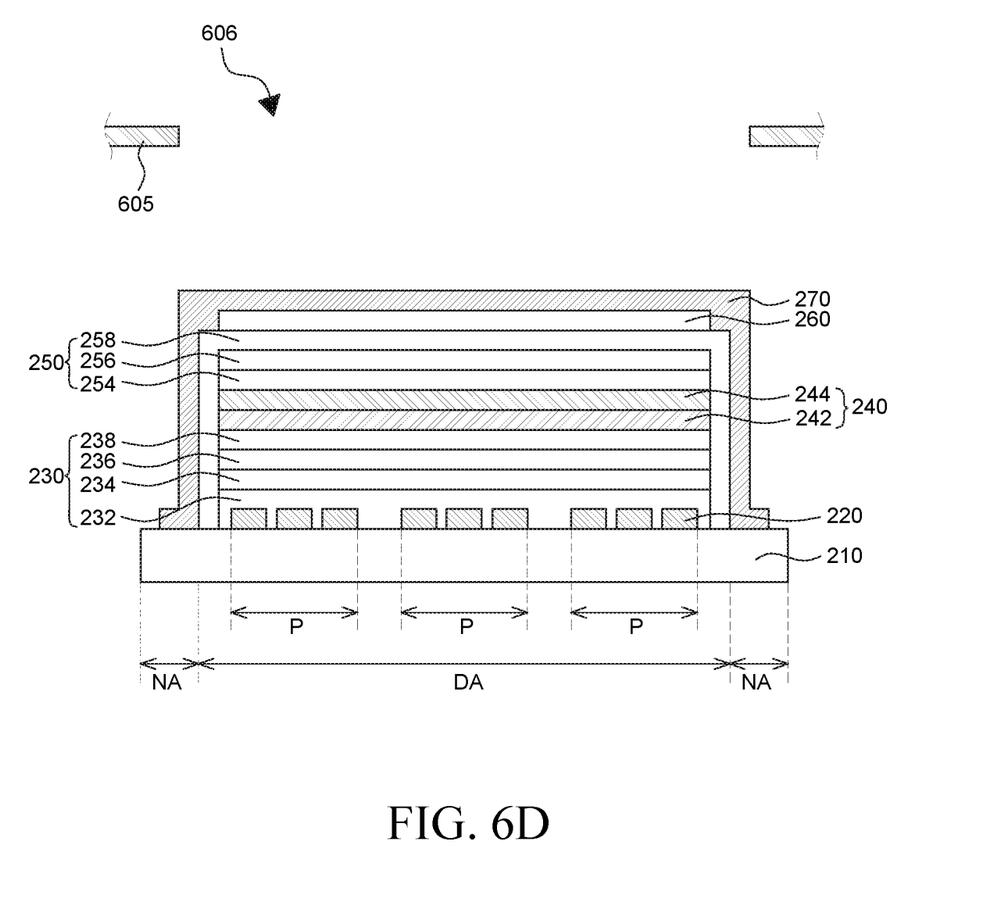

Referring to FIG. 6D, an electron injection layer 260 is disposed on the second electron transporting layer 258, and a second electrode 270 is disposed on the electron injection layer 260 as a common layer for the plurality of pixel regions P (step S560).

The second electrode 270 may be disposed by sputtering using a third common mask 605 placed above the entire surface of the substrate 210. As shown in FIGS. 6B to 6D, the size of an opening 606 of a third common mask 605 is larger than the size of the opening 602 of the first common mask 601 and the opening 604 of the second common mask 603.

In the method of manufacturing the organic light emitting display device 200 according to the exemplary embodiment of the present disclosure, it is possible to avoid direct contact between the charge generation layer 240 and the second electrode 270, even by disposing the charge generation layer 240 and the anti-contact layer using a common mask, instead of a slit mask or a slot mask.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a substrate comprising:
     a display area comprising a plurality of pixel regions; and
     a non-display area;
   a first electrode on the substrate;
   a first organic emissive layer on the first electrode;
   a charge generation layer on the first organic emissive layer as a common layer for the plurality of pixel regions;
   a second organic emissive layer on the charge generation layer;
   a second electrode on the second organic emissive layer as a common electrode for the plurality of pixel regions; and
   a non-conductive anti-contact layer between the charge generation layer and the second electrode as a common layer for the plurality of pixel regions, the anti-contact layer completely surrounding the charge generation layer, the anti-contact layer comprising an organic material.

2. The organic light emitting display device of claim 1, wherein the anti-contact layer prevents the charge generation layer from being in contact with the second electrode.

3. The organic light emitting display device of claim 1, wherein the charge generation layer comprises:
   an n-type charge generation layer; and
   a p-type charge generation layer.

4. The organic light emitting display device of claim 3, wherein the p-type charge generation layer is disposed on the n-type charge generation layer.

5. The organic light emitting display device of claim 1, wherein the thickness of the anti-contact layer is equal to or larger than 10 Å.

6. The organic light emitting display device of claim 1, wherein the anti-contact layer is one of: a hole transporting layer, a hole blocking layer, an electron transporting layer, an electron injection layer, and an electron blocking layer.

7. The organic light emitting display device of claim 6, wherein the anti-contact layer is the electron transporting layer.

8. The organic light emitting display device of claim 1, wherein the anti-contact layer is two or more of: a hole transporting layer, a hole blocking layer, an electron transporting layer, an electron injection layer, and an electron blocking layer.

9. The organic light emitting display device of claim 1, wherein the anti-contact layer is only in the display area.

10. The organic light emitting display device of claim 1, wherein the second electrode is in the display area and in a part of the non-display area.

11. The organic light emitting display device of claim 1, wherein the second electrode completely surrounds the anti-contact layer.

12. A method of manufacturing an organic light emitting display device, the method comprising:
   disposing a first electrode on a substrate comprising a display area having a plurality of pixel regions and a non-display area;
   disposing a first organic emissive layer on the first electrode;
   disposing a charge generation layer on the first organic emissive layer as a common layer for the plurality of pixel regions;
   disposing a second organic emissive layer on the charge generation layer;
   disposing a second electrode on the second organic emissive layer as a common layer for the plurality of pixel regions; and
   prior to the disposing the second electrode, disposing a non-conductive anti-contact layer on the charge generation layer as a common layer for the plurality of pixel regions, the anti-contact layer completely surrounding the charge generation layer, the anti-contact layer comprising an organic material.

13. The method of claim 12, wherein the disposing the charge generation layer and the disposing the anti-contact layer are performed by thermal evaporation.

14. The method of claim 12, wherein:
   the disposing the charge generation layer is performed using a first common mask; and
   the disposing the anti-contact layer is performed using a second common mask.

15. The method of claim 14, wherein an opening of the second common mask is larger than an opening of the second common mask.

16. The method of claim 14, wherein:
the disposing the second electrode is performed using a third common mask; and
an opening of the third common mask is larger than the openings of the first and second common masks.

* * * * *